United States Patent [19]

Olivenbaum et al.

[11] Patent Number: 4,904,947
[45] Date of Patent: Feb. 27, 1990

[54] METHOD AND CIRCUIT FOR MEASURING PULSE WIDTH

[75] Inventors: James E. Olivenbaum, Houston; Richard A. Kester, Magnolia, both of Tex.

[73] Assignee: Tideland Signal Corporation, Houston, Tex.

[21] Appl. No.: 269,270

[22] Filed: Nov. 9, 1988

[51] Int. Cl.⁴ ............ H03K 5/22/3/017; G01R 19/00
[52] U.S. Cl. .................................. 328/111; 328/112; 328/115; 328/117; 307/234; 307/265; 307/601; 307/494; 368/118; 324/76 R
[58] Field of Search ............... 328/111, 112, 115, 117; 307/234, 265, 268, 601, 494; 368/118–120; 324/73 R, 76 R

[56] References Cited

U.S. PATENT DOCUMENTS

| | | | |
|---|---|---|---|
| 3,889,197 | 6/1975 | Duff | 328/55 |
| 4,223,267 | 9/1980 | Sartorius et al. | 368/118 |
| 4,362,996 | 12/1982 | Priebe | 328/117 |
| 4,647,905 | 3/1987 | Hantke et al. | 324/76 R |

*Primary Examiner*—Andrew J. James
*Assistant Examiner*—Nancy Thai
*Attorney, Agent, or Firm*—Fulbright & Jaworski

[57] ABSTRACT

A method and apparatus of measuring the pulse width of electronic pulses which may have a large variation in amplitude. An electronic pulse includes a rising edge, a top and a falling edge and the method and apparatus measures a first point adjacent to the beginning of the rising edge, and measures a second point adjacent the beginning of the falling edge and measures the pulse width as the difference between the first and second points whereby the pulse width measurement is insensitive to the amplitude of the pulse width.

2 Claims, 1 Drawing Sheet

METHOD AND CIRCUIT FOR MEASURING PULSE WIDTH

BACKGROUND OF THE INVENTION

In various applications it is particularly important to measure the pulse width of an electrical or electronic pulse accurately. For example, a racon is a microwave transponder which receives a radar pulse from a ship and provides a reply signal which locates and identifies the racon. The incoming pulses may have differing amplitudes and the racon must accurately measure both the frequency and the pulse width as parameters to identify a particular radar source.

It is well known to measure the pulse width of an electronic pulse by use of a comparator which changes state when the input pulse exceeds a threshold or reference voltage. However, this method will produce inaccurate results in the event that the measured electronic pulses have a large variation in amplitude.

The present invention is directed to a method and circuit which will provide accurate measurement of the pulse width of an electrical pulse which may have a large variation in amplitude.

SUMMARY

The Present invention is directed to a method of measuring the pulse width of electrical pulses having a rising edge, a top, and a falling edge and includes measuring a first Point adjacent to the beginning of the rising edge, measuring a second point adjacent the beginning of the falling edge, and measuring the pulse width as the difference between the first and second points whereby the pulse width measurement is insensitive to the amplitude of the pulse width.

Still a further object of the present invention is the provision of a circuit for measuring the pulse width of an electronic pulse and includes a comparator having a first and a second input, in which the first input receives the electronic pulse to be measured. A reference amplifier is provided having an input and an output in which the output is connected to the second input of the comparator. A time constant circuit is connected between the output of the amplifier and the second input of the comparator for providing a reference on the second input which lags the electronic pulse to be measured whereby the output of the comparator provides an output measuring the pulse width of the electronic pulse.

Still a further object is wherein the time constant circuit includes an RC timing circuit and a voltage divider.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

Figure 1:
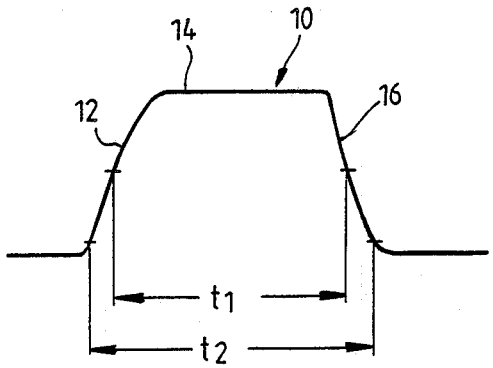
FIG. 1 is a graph of a wave form illustrating conventional methods of measurement of pulse width.

Referring now to the drawings, and particularly to FIG. 1, the reference numeral 10 generally shows a typical electronic pulse with amplitude on the vertical axis and time on the horizontal axis. The pulse 10 includes a rising edge 12, a top 14 and a falling edge 16. The rising edge 12 has a finite rise time TR and the falling edge 16 has a finite fall time TF. The rise time TR and the fall time TF may be, but are not necessarily, equal. Conventionally, the pulse width of the pulse 10 is measured as the time from 50% of the rising edge 12 or rise time TR to 50% of the falling edge 16 or fall time TF. Therefore, for example, if the pulse 10 has a two millivolt amplitude and a comparator is used to measure the pulse width is set with a threshold equal to one millivolt, the comparator would measure the time t1 which is an accurate measurement of the pulse width. However, if the comparator being used maintained its threshold of one millivolt but the pulse 10 had an amplitude of 100 millivolts, the comparator would measure the pulse width between the 1% points of the rise 12 and the fall 16. In that case, the comparator would measure time t2 as the pulse width, which is considerably wider than time t1 and would therefore provide an inaccurate measurement of the pulse width of the pulse 10.

Figure 2:
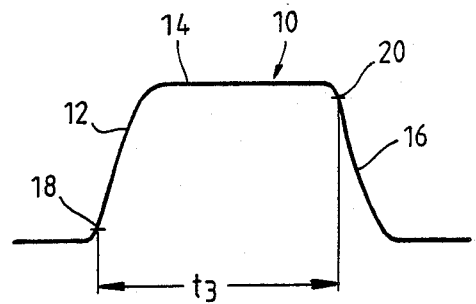
FIG. 2 is a graph of a wave form illustrating the method of measurement of Pulse width of the present invention.

FIG. 2 illustrates the method of the present invention in which the measurement of the pulse width of pulse 10 includes a measurement of a first point 18 adjacent to the beginning of the rising edge 12 and measuring a second point 20 adjacent the beginning of the falling edge 16 measuring the pulse width t3. The difference between the first 18 and the second 20 points, the pulse width measurement t3, is substantially equal to t1 of FIG. 1 and is insensitive to the amplitude of the pulse 10. Therefore, the present invention is directed to the method and circuit of measuring the pulse width at a point just as the pulse is beginning to rise and just at the point where the pulse is beginning to fall.

Figure 3:
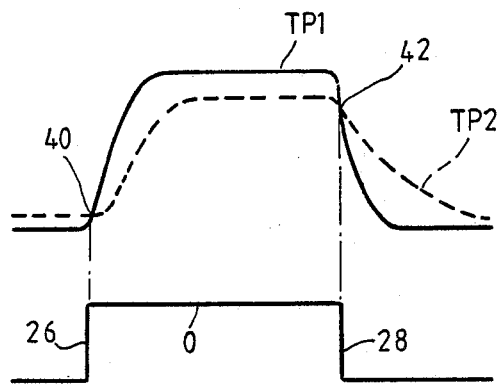
FIG. 3 is a graph illustrating a comparison between a reference signal and the incoming signal to provide a pulse width measurement.
Figure 4:
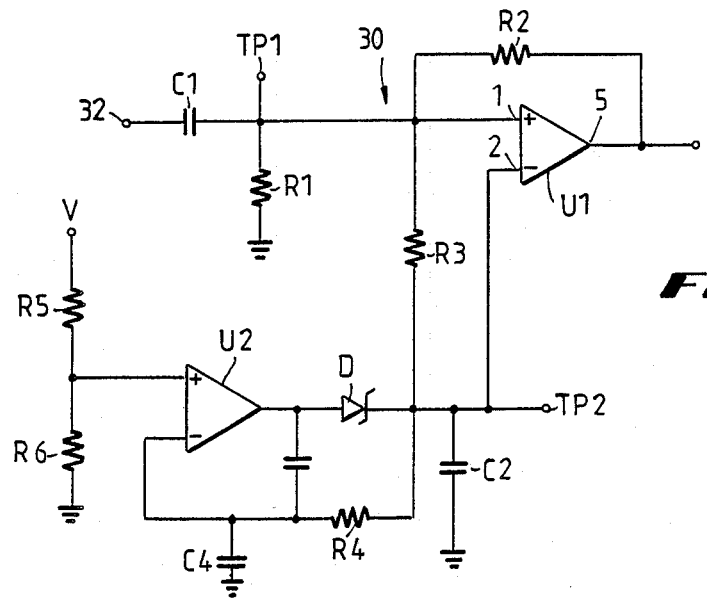
FIG. 4 is a schematic of an electrical circuit for measuring the pulse width of an electronic pulse.

Referring now to FIG. 4, a circuit generally indicated by the reference numeral 30 is shown for implementing the present method. While other circuits may be used, the particular circuit 30 is particularly useful in an application in a racon which is measuring pulse widths between 50 nanoseconds and approximately 2 microseconds. The incoming pulse wave form is connected to input 32 through a capacitor C1 and as measured at test point TP1 is of the form TP1 illustrated in FIG. 3. TP1 has a sharp rise with an exponential settling to a final value and then a sharp fall with an exponential fall to the final settled value. U1 is a comparator having a first input 1 and a second input 2 and an output 5. The incoming wave form is AC coupled so that the pin 1 or the positive input of U1 will typically be at zero volts.

The threshold or reference voltage for the comparator U1 which is applied to pin 2 is controlled by the input pulse applied to input 32. Under steady state conditions, the threshold at the input pin 2 of the comparator U1 is equal to the voltage into a reference amplifier U2, for example, 25 millivolts. As soon as the input voltage at input 32 is coupled through capacitor C1, the input at pin 1 of U1 rises above the 25 millivolts and the output pin 5 of U1 goes from zero to positive as illustrated in the output wave form 0, shown in FIG. 3, providing a leading edge 26.

The present invention differs from a conventional comparator circuit in what is occurring at test point TP2, which is the inverting input to pin 2 of comparator U1. Wave form TP2 in FIG. 3 illustrates the wave form at test point TP2 in FIG. 4. On the positive input to U2, a voltage divider consisting of R5 and R6 is provided going to ground to provide approximately 25 millivolts from the voltage source V. With the feedback resistor R4, U2 will have an output equal to its input voltage since there will be essentially no current through R4 since this is a high input impedance amplifier. A diode D is located between the output of U2 and TP2. This diode D allows moving the voltage at TP2 in a positive direction and turning off the diode D and disconnecting its output from amplifier U2.

A time constant circuit and voltage divider is provided between the output of U2 and the second input 2 of U1. A voltage divider formed by R3 and R4, which may be 10 K and 40 K, respectively, insures that the voltage on pin 2 of U1 is approximately 80% of the voltage that's on input pin 1 because of the voltage divider ratio. Capacitor C4 is a larger capacitor and the inverting input on pin 2 of U1 will track the incoming signal on input 32 but will not get up to the full value of the incoming signal. This is shown in the curve TP2 in FIG. 3 as the voltage at point TP2 is slowed down by capacitor C2. That is, the curve TP2 rises at a slower rate than does the voltage coming in TP1. But capacitor C2 also insures that the voltage at TP2 will fall at a slower rate. Therefore, the voltage curve TP2 acts as a threshold or reference at the incoming pin 2 of the comparator U1 to cause the output 5 to change states to provide a trailing edge 28 of the square wave output curve O which is a measurement of the pulse width of the incoming curve at TP1.

Initially, the voltage at TP2 under steady state conditions is the voltage of reference amplifier U2, in this particular case, 25 millivolts. As soon as the input voltage coupled to input 32 rises above the 25 millivolts, at point 40 on FIG. 3, the output pin 5 of comparator U2 goes from zero to plus as illustrated as leading edge 26 in output curve 0. The timing circuit causes the voltage TP2 to rise at a slower rate than the voltage coming in on TP1 but also causes the voltage on TP2 to fall at a slower rate than the voltage on TP1. At point 42 on the graph in FIG. 2, the incoming pulse TP1 falls quickly enough so that it goes to a value smaller than that on the reference voltage TP2. When this happens the comparator U1 will again change states to provide the trailing edge 28 of the output signal 0. In the particular example given, the reference threshold shown by the curve TP2 is set to trip at the same relative position, for example, 10% after the pulse begins to rise and 10% just after the beginning of the falling edge thereby providing a comparator U1 that is insensitive to changes in the amplitude of the incoming signals.

Resistor R2 is a conventional feedback resistor from the output to the plus input of U1 and is a commonly used method to provide hysteresis to prevent multiple triggering of the comparator U1 in the presence of noise.

Therefore, in operation, the reference value TP2 under steady state conditions is equal to the voltage into the reference amplifier U2 and when the input voltage at TP1 exceeds this threshold, the output 5 of comparator U1 changes state to measure the leading edge 26 of the pulse. When the input pulse TP1 is high, the reference voltage at TP2 is increasing at a slower rate than the input voltage at TP1 due to the time constant formed by R3, R4 and C2. The voltage divider formed by R3 and R4 prevents the reference voltage at TP2 from reaching the input voltage at TP1. C4 is a large capacitor which keeps the voltage at the common point of R4 and C4 essentially constant during the time that the pulse is Present. When the input pulse at T1 falls, the reference voltage at TP2 falls, but at a slower rate due to the time constant above described. The input voltage then falls below the reference voltage TP2 and the comparator U1 changes state, indicating the trailing edge 28 of the input Pulse.

The present invention, therefore, is well adapted to carry out the objects and attain the ends and advantages mentioned as well as others inherent therein. While a presently preferred embodiment of the invention is given for the purpose of disclosure, numerous changes in the details of construction and arrangement of parts will be readily apparent to those skilled in the art and which are encompassed within the spirit of the invention and the scope of the appended claims.

What is claimed is:

1. A circuit for measuring the pulse width of an electronic pulse comprising,
   a comparator having first and second inputs, said first input receiving the electronic pulse to be measured,
   a fire capacitor connected between the first input of the comparator and the electronic pulse,
   a reference amplifier having an input and an output said output connected to the second input of the comparator,
   a time constant circuit connected between the output of the reference amplifier and the second input of the comparator for providing a reference on the second input which lags the electronic pulse to be measured whereby the output of the comparator providing an output measuring the pulse width of the electronic pulse.

2. The circuit of claim 1 wherein the time constant circuit includes an RC timing circuit and voltage divider including a first and second resistor and a second capacitor, said first resistor, second resistor, and second capacitor connected to the output of the amplifier.

* * * * *

UNITED STATES PATENT AND TRADEMARK OFFICE
CERTIFICATE OF CORRECTION

PATENT NO. : 4,904,947

DATED : February 27, 1990

INVENTOR(S) : James E. Olivenbaum et al

It is certified that error appears in the above-identified patent and that said Letters Patent is hereby corrected as shown below:

Column 1, line 64, change "Pulse" to -- pulse --

Column 4, line 39, delete "fire" and insert -- first --

Column 4, line 41, after "output" insert -- , --

Signed and Sealed this

Thirteenth Day of August, 1991

Attest:

HARRY F. MANBECK, JR.

*Attesting Officer*  *Commissioner of Patents and Trademarks*